United States Patent
Perez-Bolivar et al.

(10) Patent No.: US 9,087,973 B1
(45) Date of Patent: Jul. 21, 2015

(54) EGRESS AND/OR FLICKER-FREE LIGHTING DEVICE WITH PERSISTENT LUMINESCENCE

(71) Applicant: Grote Industries, LLC, Madison, IN (US)

(72) Inventors: Cesar Perez-Bolivar, Madison, IN (US); Timothy Webster Brooks, Madison, IN (US)

(73) Assignee: Grote Industries, LLC, Madison, IN (US)

( * ) Notice: Subject to any disclaimer, the term of this patent is extended or adjusted under 35 U.S.C. 154(b) by 0 days.

(21) Appl. No.: 14/309,939

(22) Filed: Jun. 20, 2014

(51) Int. Cl.
*H01L 33/62* (2010.01)

(52) U.S. Cl.
CPC ...................................... *H01L 33/62* (2013.01)

(58) Field of Classification Search
CPC ............... H01L 33/50; H01L 2924/12041; H01L 33/52; H05K 2201/10106; H05K 3/284
USPC .................................................. 313/498–512
See application file for complete search history.

(56) References Cited

FOREIGN PATENT DOCUMENTS

| CN | 101140971 A | 3/2008 |
|---|---|---|
| JP | 2003197979 A | 7/2003 |

OTHER PUBLICATIONS

Yun, J-j., Oh, G-c., Park, S-m. and Han, E-m., Abstract: "Opto-electric properties in the phosphor-doped polymeric light-emitting diodes." In: Light-Emitting Diodes: Research, Manufacturing, and Applications VI, San Jose, CA, Jan. 22-24, 2002, Bellingham, WA, Society of Photo-Optical Instrumentation Engineers, p. 60-67. : s.n., p. 8.

Hunter, D N and Jia, D., Abstract: "Long persistent light emitting diode." J Appl Phys, 2006, Issue 11, vol. 100. 9.

Gu, Hal-bon, Han, Eun-mi, Oh, Gwang-chae, Park, Su-mi, Yoon, Young-seek and Yun, Je-jung., Abstract: "The doping effect of long afterglow phosphorescent pigments in the polymeric light-emitting diodes." Seoul, South Korea : s.n., 2002. Mol Cryst Liq Cryst Sci Technol Sect A Mol Crys Liq Cryst. vol. 377, pp. 61-64.

*Primary Examiner* — Tracie Y Green
(74) *Attorney, Agent, or Firm* — Posz Law Group, PLC

(57) ABSTRACT

A lighting device can include a substrate, two or more light-emitting elements formed over the substrate, an affixing layer fixing the two or more light-emitting elements in place, and a transparent conductive layer in electrical contact with the light-emitting elements. The substrate and the transparent conductive layer sandwich the affixing layer with the light-emitting elements in place. The affixing layer is an electrically insulating material. The affixing layer is doped with a photo active or photochromic material. In a first mode when the light-emitting elements are energized, the photo active or photochromic material of the affixing layer is excited by the light-emitting elements. In a second mode when the light-emitting elements are de-energized, the affixing layer produces a persistent luminescence.

22 Claims, 6 Drawing Sheets

(POWERED ON)

EGRESS AND/OR FLICKER-FREE LIGHTING DEVICE WITH PERSISTENT LUMINESCENCE

TECHNICAL FIELD

The technical field relates generally to a lighting device integrally formed of layers with a plurality of light-emitting elements sandwiched in a layer(s). More particularly, the technical field relates to structure in which the integral layer (s) that has the light-emitting elements is doped to provide persistent luminescence.

BACKGROUND

A majority of lighting devices directed to egress application technology that use afterglow, comprise photo-excited films which are painted on a desired structure. A conventional application is for egress lighting, for buildings, for aerospace applications, and so on. The conventional film painted on the application has to be painted from the outside onto the structure, from sources that are around the structure. The film in conventional devices is always painted onto whatever is the long-lived emission.

The film and the paint are excited by the light absorbed from the environment. These materials are conventionally used to indicate an exit after a light is off. This leaves the known afterglow film as the only option, for example, for people to find the exit, in a manner which is consequently dependent on the time of the excitation and the power of the excitation.

SUMMARY

In accordance with one or more embodiments, a lighting device includes a substrate; two or more light-emitting elements formed over the substrate; an affixing layer fixing the two or more light-emitting elements in place; and a transparent conductive layer in electrical contact with the light-emitting elements. The substrate and the transparent conductive layer sandwich the affixing layer with the light-emitting elements in place. The affixing layer is an electrically insulating material. The affixing layer is doped with a photo active or photochromic material. In a first mode when the light-emitting elements are energized, the photo active or photochromic material of the affixing layer is excited by the light-emitting elements. In a second mode when the light-emitting elements are de-energized, the affixing layer produces a persistent luminescence.

In another embodiment, in the first mode, while using AC voltage to drive the light-emitting elements, during the off-cycle of the AC, the light-emitting elements are off and the affixing layer surrounding the light-emitting elements produces the persistent luminescence for at least a duration of the off-cycle of the AC, to avoid flickering during the off-cycle.

In yet another embodiment, the transparent conductive layer is semi-transparent and bounces at least some of the light from the light-emitting elements back into the affixing layer to further excite the affixing layer to produce additional persistent luminescence.

In still another embodiment, the lighting device further includes a semi-transparent layer sandwiching the transparent conductive layer, the semi-transparent layer bounces at least some of the light from the light-emitting layer back into the affixing layer to further excite the affixing layer to produce additional persistent luminescence.

In a further embodiment, the light-emitting elements can be oriented any direction in the affixing layer, to emit the persistent luminescence when the lighting device is powered down.

In yet a further embodiment, the wave length of the light-emitting elements is UV or blue.

In still a further embodiment, the affixing layer includes non-doped areas to comprise a pattern of a pre-determined non-persistent-luminescent area.

Another embodiment provides an emergency light. The emergency light includes one or more combinations of embodiments of the above lighting device, driven by DC voltage. In a power-on mode the DC voltage drives the light emitting elements. In a power-off mode, the DC voltage does not drive the light emitting elements, and the affixing layer acts as a persistent luminescent marker.

In accordance with another embodiment, there is provided a lighting device, which includes a substrate; two or more light-emitting elements formed over the substrate; a protective surrounding layer fixing the two or more light-emitting elements in place. The protective surrounding layer is doped with a photo active or photochromic material. In a first mode when the light-emitting elements are energized, the photo active or photochromic material of the affixing layer is excited by the light-emitting elements. In a second mode when the light-emitting elements are de-energized, the affixing layer produces a persistent luminescence.

In another embodiment, in the first mode, while using AC voltage to drive the light-emitting elements, during the off-cycle of the AC, the light-emitting elements are off and the protective surrounding layer surrounding the light-emitting elements produces the persistent luminescence for at least a duration of the off-cycle of the AC, to avoid flickering during the off-cycle.

Yet another embodiment further includes a semi-transparent layer sandwiching the protective surrounding layer, the semi-transparent layer bounces at least some of the light from the light-emitting layer back into the protective surrounding layer to further excite the protective surrounding layer to produce additional persistent luminescence.

In still another embodiment, the light-emitting elements can be oriented any direction in the protective surrounding layer, to emit the persistent luminescence when the lighting device is powered down.

In a further embodiment, the wave length of the light-emitting elements is UV and/or blue.

According to another embodiment, there is provided an emergency light. The emergency light includes one or more combinations of embodiments of the above lighting device, driven by DC voltage. In a power-on mode the DC voltage drives the light emitting elements. In a power-off mode, the DC voltage does not drive the light emitting elements, and the protective surrounding layer acts as a persistent luminescent marker.

According to still another embodiment, there is a method of forming a lighting device. The method includes providing a substrate; forming two or more light-emitting elements over the substrate; forming an affixing layer on the substrate fixing the two or more light-emitting elements in place; and forming a transparent conductive layer over the affixing layer. The substrate and the transparent conductive layer sandwich the affixing layer with the light-emitting elements in place. The affixing layer is an electrically insulating material. The affixing layer is doped with a photo active or photochromic material. In a first mode when the light-emitting elements are energized, the photo active or photochromic material of the affixing layer is excited by the light-emitting elements. In a second mode when the light-emitting elements are de-energized, the affixing layer produces a persistent luminescence when energized.

In an embodiment of the method, the transparent conductive layer is semi-transparent and bounces at least some of the light from the light-emitting elements back into the affixing layer to further excite the affixing layer to produce additional persistent luminescence.

An embodiment of the method can further include forming a semi-transparent layer on the transparent conductive layer, in which the semi-transparent layer bounces at least some of the light from the light-emitting layer back into the affixing layer to further excite the affixing layer to produce additional persistent luminescence.

In another embodiment of the method, the wave length of the light-emitting elements is UV or blue.

Still another embodiment can include pre-forming the affixing layer to include non-doped areas to comprise a pattern of a pre-determined non-persistent-luminescent area.

In accordance with various embodiments, there may be provided a method of forming a lighting device. The method can included providing a substrate; forming two or more light-emitting elements over the substrate; and forming a protective surrounding layer on the substrate with the two or more light-emitting elements, the protective surrounding layer fixes the two or more light-emitting elements in place. The protective surrounding layer is doped with a photo active or photochromic material. In a first mode when the light-emitting elements are energized, the photo active or photochromic material of the protective surrounding layer is excited by the light-emitting elements. In a second mode when the light-emitting elements are de-energized, the protective surrounding layer produces a persistent luminescence.

The method can further include forming a semi-transparent layer on the protective surrounding layer, the semi-transparent layer bounces at least some of the light from the light-emitting layer back into the protective surrounding layer to further excite the protective surrounding layer to produce additional persistent luminescence.

In an embodiment of the method, the wave length of the light-emitting elements is UV and/or blue.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the embodiments. These drawings are not necessarily drawn to scale.

DETAILED DESCRIPTION

Figure 1:
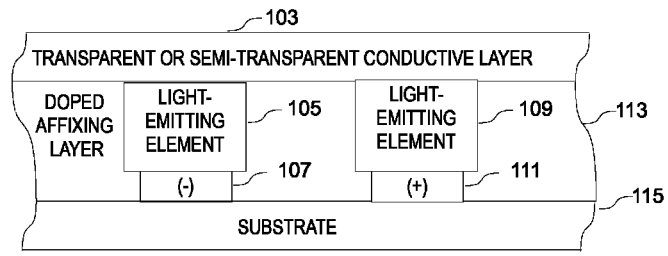
FIG. 1 is a cross-sectional view of a lighting device with light-emitting elements in an affixing layer according to a first embodiment.

In overview, the present disclosure concerns lighting devices, used for applications such as egress lighting or in an application sensitive to flickering, for example in LED lighting. More particularly, various inventive concepts and principles are embodied in lighting devices, systems, and methods therein in which an extra component may be included in a remote phosphor, remote emissive material, or adhesive, to contain a long lived radiative emission, which can avoid the flickering routinely observed in LED lighting.

A specific LED application can comprise a combination of an LED, for example in a form of a flexible strip, and a photo-luminescent material, in which the luminescent material is embedded within the coating of the device, for example a polymer coating, and the excitation for the lighting device also comes from within the polymer coating.

The instant disclosure is provided to further explain in an enabling fashion the best modes of performing one or more embodiments. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Furthermore, elements having the same number represent the same element across the various figures, and throughout the disclosure. Their description is not always repeated for each embodiment, but may be inferred from previous descriptions. Elements that have the same number but have the addition of a letter designator indicate distinct embodiments of a more generic element.

As further discussed herein below, various inventive principles and combinations thereof are advantageously employed to reduce constraints on the usable time since the excitation source will come from within the afterglow-containing film. The LEDs will excite the film. The lighting may be run with battery power, if desired, which can be turned on and/or off thereby providing a longer time for the afterglow, for the protection of the end users.

Further in accordance with exemplary embodiments, a long lived material can be used, for example in an AC lighting application. The long lived luminescent material can be embedded in an adhesive or mixed with a remote emissive material to create a flicker-free LED lighting solution, for example, when the LEDs are driven directly from an AC source without the use of electronics to power up the LEDs while the waveform drops to zero volts. The typical "flicker" normally observed in conventional devices will not be noted since it will be asked by the long lived emissive decay process of the materials.

Moreover, the lighting device can be used for egress lighting, for buildings, for aerospace applications, etc. In such applications, the conventional film painted on the application has to be painted from the outside onto the structure; the film that is painted on a conventional device is what provides the long-lived emission. Here, the present lighting device does not use a film or paint which is applied to a structure, but it is an adhesive which is a physically integral part of the lighting device structure, which produces the persistent luminescence.

First Embodiment

Referring now to FIG. 1, a cross-sectional view of a lighting device with light-emitting elements in an affixing layer according to a first embodiment will be discussed and described. A lighting device 100 can include a conductive layer 103, light emitting elements 105, 109, first and second electrical connections 107, 111, an affixing layer 113, and a substrate 115.

The substrate 115 can serve as a base for the remainder of the lighting device 100. As a reference direction, the substrate 125 can be considered to be a "bottom" substrate upon which the other elements are stacked. However, this is as a point of reference only. The lighting device 100 has no inherent direction, and can be oriented in any manner, even with the substrate 115 being on the "top" of the structure.

The substrate 115 can be made of polyethylene terephthalate (PET), polyethylene napthalate (PEN), polyester, a polymer, an oxide-coated polymer, a flexible plastic, a metal-coated flexible plastic, or any suitable material. In some embodiments, the substrate 115 may be flexible. If the entire lighting device is to be flexible, then the substrate 115 should be flexible. Because light does not shine out of the substrate 115, it is not necessary for the substrate 115 to be transparent to light.

The first and second electrical connections 107, 111 are located on the substrate 115. Each of the first and second electrical connections 107, 111 can be made of a conductive material that can be connected to a control circuit used to control the lighting device 100, and can be configured to carry a control current generated by the control circuit. For example, the first and second electrical connections 107, 111 may be buss bars used to conduct electricity throughout a lighting device 100. In alternate embodiments the first and second electrical connections 107, 111 may be wires or any other conductive structure that can pass current to the light-emitting element 105, 109. The first and second electrical connections may further be connected using: silver epoxy dots, conductive adhesive, metal pads, or other conductive metal elements. The first and second electrical connections 107, 111 may be made of copper, silver, aluminum, or any suitable conductive metal or conductive oxide. If the resulting lighting device 100 must remain flexible, the first and second conductive elements 107, 111 can be configured such that they can bend without breaking or losing their ability to carry a current.

The conductive layer 103 can be a transparent or semi-transparent conductive layer, using known techniques and conventional materials. In this embodiment, the transparent or semi-transparent conductive layer 103 is used to close the electrical circuit to the light emitting elements 105, 109. The conductive layer 103 can be, for example, a transparent conductive oxide (TCO) layer made of indium tin oxide, tin oxide, zinc oxide, carbon nanotubes, ultra-thin metals, or any suitable transparent, conductive material.

It is generally desirable that the affixing layer be substantially transparent to the wavelengths of light that are emitted from the light-emitting element 105, 109, so that light from the light-emitting elements 105, 109 can pass through the affixing layer 113.

The affixing layer 113 can be doped with a photo active or photochromic material which is a material that provides a luminescent emission or changes its color after excitation. The photo active material can provide a short-lived to a long-lived emission after excitation, with an emission decay at least from a microsecond regime all the way up to hours. A long lived material can be used. The material could be doped into an adhesive or mixed with a remote emissive material. Chemicals used for doping with the photo active or photochromic material are fairly standard and are generally commercially available. Appropriate photochromic materials include, for example, spiropyrans, diarylethers, quinones derivatives, azobenzenes families of compounds or inorganic salts. Appropriate materials for doping the affixing layer with a photo active material include long lived emission materials; the long lived emission materials can be, for example, gold complexes, cadmium or zinc sulfides doped with copper, or newer materials as strontium oxide-based compounds or heavy-atom-doped organic materials or pure organic phosphors. The doping material can be doped into different materials which will work for the same purposes, i.e., as the affixing material.

The light emitting elements 105, 109 are conventionally available. The light-emitting element 105, 109 can be configured to generate light based on the control current carried on the first and second electrical connections 107, 111. One exemplary light-emitting element 105, 109 is a light-emitting diode (LED). An LED has an anode (i.e., a positive side) and a cathode (i.e., a negative side), and operates to generate light of a specific wavelength (from infrared to ultraviolet, i.e., having a wavelength from 10 nm to 100,000 nm) when current flows through the LED from the anode to the cathode. Appropriate ranges of wavelengths for the light emitting elements 105, 109 are between UV and blue. Thus, in an embodiment, the wave length of the light-emitting elements is UV or blue. Thus, there can be different colors used for the persistent luminescent materials. The reason for using the different wavelengths is so that the light is visible, or so that the light can be moved from blue to a different color.

The light emitting elements 105, 109 can be formed over the substrate 115, and are in the affixing layer 113. The lighting emitting elements 105, 109 can be pre-formed into a desired pattern within the lighting device 100, using known techniques.

The light emitting elements are electrically connected to the conductive layer 103 and the substrate 100 via positive and negative electrical connections 107, 111.

By comparison, in the fixing layer of a traditional device, conventionally there is provided a hot melt which acts as the adhesive to keep the top and bottom substrates with LED chips sandwiched together. For example, in the traditional device illustrated in U.S. Pat. No. 7,052,924 to Daniels et al. (Daniels), an adhesive matrix, into which emissive particulate such as LED chips are embedded, secures top and bottom substrates. Sometimes, a traditional device includes UV LED chips and a phosphor re-emitter additive dispersed in the matrix between the substrates, the re-emitter additive being in essence short-lived after excitation in AC mode. Such a traditional device can experience flicker because of the short-lived excitation.

In the present application, for example as in the lighting device 100, the material which comprises the affixing layer, for example, hot melt, is loaded with a long lifetime luminescent material which is selected because it will glow in the dark, for a long time. When the lighting device is powered on, the lighting device excites the molecules in the polymer with the light coming from the light emitting elements 105, 109. When the light is powered off, the light provides a persistent luminescence from the doped affixing layer 113.

In summary, the lighting device 100 includes the substrate 115, the affixing layer 113, and the light emitting elements 105, 109 (sometimes referred to as LEEs or LEDs) are embedded in the affixing layer 113. An indium tin oxide (ITO) product can be part of one of the layers, for example the transparent or semi-transparent conductive layer 103, in accordance with known techniques, to provide an electrical connection between light emitting elements 105, 109. The transparent or semi-transparent conductive layer 103 can be provided with or without phosphor.

The affixing layer 113 can be, for example, formed from a conventional hot melt that mechanically fixes the elements together and keeps them in place. The affixing layer 113 can be an electrical insulator. The conductive path, from the substrate 115 to the transparent conductive layer 103, flows through the light emitting elements 105, 109. The affixing layer, such as an adhesive, or for example a hot melt, flows around the different elements so that the elements of the conductive path are mechanically touching and electrically connected so as to create a pathway from the transparent conductive layer 103 to the bottom substrate 100 through the light-emitting elements 105, 109. Thus, the source of the excitation of the doped affixing layer comes from within the affixing layer itself.

Figure 2A:
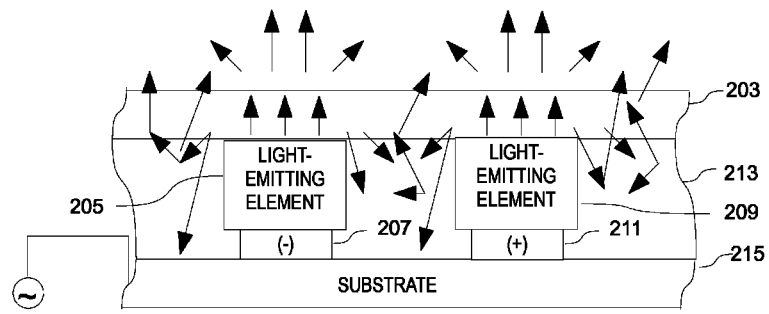
FIG. 2A is a cross-sectional view of the lighting device showing excitation of the doped affixing layer.
Figure 2B:
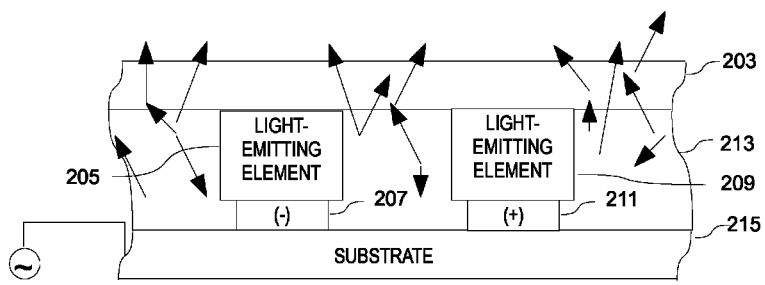
FIG. 2B is a cross-sectional view of the lighting device showing persistent luminescence with de-energized light-emitting element.

FIG. 2A and FIG. 2B illustrate excitation of the doped affixing layer with the energized light emitting elements, and persistent luminescence with the de-energized light emitting elements, in first and second modes, respectively. Referring now to FIG. 2A, a cross-sectional view of the lighting device showing excitation of the doped affixing layer will be discussed and described. In review, a lighting device can include a conductive layer 203, light emitting elements 205, 209, electrical connections 207, 211, an affixing layer 213, and a substrate 215. The two light-emitting elements 205, 209 are representative of two or more light-emitting elements formed over the substrate 215, which can be provided according to conventional techniques; there is an affixing layer 213 which fixes the two or more light-emitting elements 205, 209 in place (generally the structure can be provided in accordance with conventional techniques).

Also, there is a transparent or semi-transparent conductive layer 203, which also can be provided according to conventional techniques. This layer is transparent or semi-transparent to light from the light-emitting elements 205, 209. The substrate 215 and the transparent conductive layer 203 sandwich the affixing layer 213 with the light-emitting elements 205, 209 in place according to known techniques. The top layer 203 can be semi-transparent to further bounce some of the light from the affixing layer, which can be transparent and thus can emit light, back into the affixing layer to produce additional luminescence. Thus, the semi-transparent conductive layer bounces at least some of the light from the light-emitting elements back into the affixing layer to further excite the affixing layer to produce additional persistent luminescence.

The affixing layer 213 is doped with a photo active or photochromic material that is excited by the light-emitting elements 205, 209 in a first mode when the light-emitting elements are energized. The electrically insulating material of the affixing layer 213 can be excited with the light from the light emitting elements 205, 209. Although the light from the energized light-emitting elements 205, 209 can be principally emitted through the transparent conductive layer 203, some of the light from the LEE's bounces to the transparent conductive layer 203, and then moving to the side and then back into the affixing layer 213 as illustrated, is going to excite the material doped into the adhesive of the affixing layer 213.

Referring now to FIG. 2B, a cross-sectional view of the lighting device showing persistent luminescence with de-energized light-emitting element will be discussed and described. The affixing layer 213, which is so doped, produces and continues to produce a persistent luminescence in a second mode which is when the light-emitting elements 205, 209 are de-energized, as illustrated in FIG. 2B. The affixing layer 213, which is doped into the photo active or photochromic material not previously used for this application, but remains an electrical insulator, produces a persistent luminescence when the light-emitting elements 205, 209 are de-energized.

A point is that the hot melt has the photo active or photochromic material, which is a long lifetime luminescent material. Accordingly, when the LEE 205, 209 is de-energized for any reason, the material of the affixing layer 213 which surrounds the LEE is persistently luminescent in the second mode due to the excitation that happened during the first mode. The persistent luminescence can persist at a sufficiently significant level that a decrease in luminescence is not noticeable to a human until the light-emitting elements 205, 209 are re-energized. Consequently, a normal cycle which repeats of first mode-second mode-first mode, etc. during a normal power-on state of a lighting device does not result in annoying flicker. Further, if the lighting device is totally powered down, the lighting device continues to provide a glow due to the persistent luminescence in the affixing layer which was excited.

In comparison to known devices, the affixing layer 213 is doped with (or comprised of) a photo active or photochromic material which is excited by the light emitting elements 205, 209 and which continues to produce a persistent luminescence when the light emitting elements are de-energized.

In particular, FIG. 2A shows that light passing through the transparent or semi-transparent conductive layer 203 will contact the photo active or photochromic material doped in the conductive layer 213, and will scatter, possibly multiple times as it contacts and excites multiple dopants, until it emerges from the conductive layer 203, in a first mode when the light-emitting elements are energized. Then, as shown in FIG. 2B, the light emitted from the affixing layer 213 will be effectively randomized so as to appear to be emitted from the affixing layer 213 as a whole, thereby appearing to glow on its own, in a second mode when the light-emitting elements are de-energized.

Thus, in accordance with one or more embodiments, a lighting device includes a substrate; two or more light-emitting elements formed over the substrate; an affixing layer fixing the two or more light-emitting elements in place; and a transparent conductive layer in electrical contact with the light-emitting elements. The substrate and the transparent conductive layer sandwich the affixing layer with the light-emitting elements in place. The affixing layer is an electrically insulating material. The affixing layer is doped with a photo active or photochromic material. In a first mode when the light-emitting elements are energized, the photo active or photochromic material of the affixing layer is excited by the light-emitting elements. In a second mode when the light-emitting elements are de-energized, the affixing layer produces a persistent luminescence.

Figure 3:
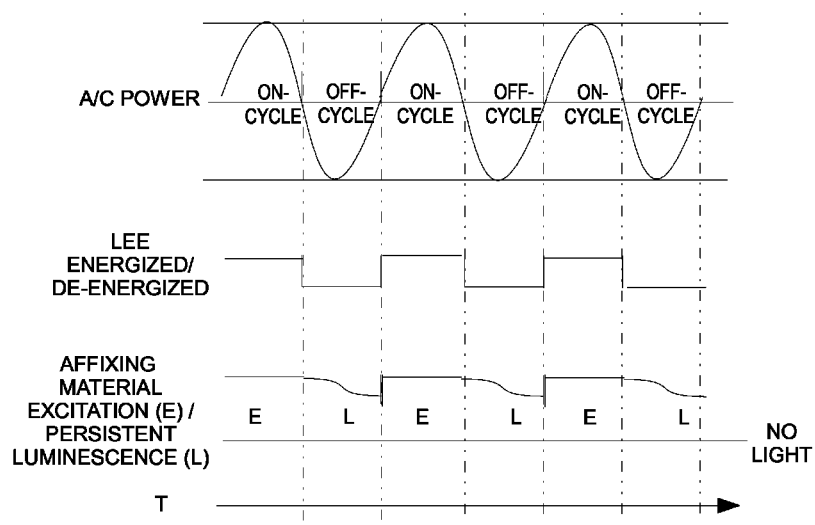
FIG. 3 is a timing diagram illustrating timing of alternating current ("A/C") power and persistent luminescence.

Referring now to FIG. 3, a timing diagram illustrating timing of alternating current ("A/C") power and persistent luminescence will be discussed and described. In this timing diagram a normal A/C power cycle is illustrated, which powers the light-emitting elements. The normal A/C power cycle cycles between a positive cycle and a negative cycle, as is well known. The light emitting element ("LEE") is on during the positive cycle and off during the negative cycle (sometimes referred to as "on-cycle" and "off-cycle", respectively). During the on-cycle, the light emitting elements are energized (corresponding to the "first mode"), and during the off-cycle, the light emitting elements are de-energized (corresponding to the "second mode"). The light emitting element is off during the negative part of the sign of the AC cycle; when the wave comes back up, the light emitting element is on.

During the on-cycle of the AC power, which is when the LEE is energized, the affixing material is excited E by the light from the LEE. During the off-cycle of the AC power, when the LEE is de-energized, the affixing material produces a persistent luminescence L. Generally, the light produced during excitation E is a steady level, and the light produced by the affixing material during the persistent luminescence is at a level that gradually decays. The light from the affixing material during the off-cycle however never completely decays before the on-cycle of the A/C power resumes, and in fact the light during the persistent luminescence from the affixing material, which was excited during the on-cycle, only partially decays during the off-cycle of the A/C power. As a consequence, there is no visible flicker which is otherwise observed during the off-cycle of the A/C power.

This can create a flicker-free LED lighting solution, such as when the LED's are driven directly from an AC source, without the use of additional electronics to power up LED's while the waveform drops to zero volts. The typical "flicker" from the zero crossing will not be noted on the overall light condition since the flicker will be masked by the long lived emissive decay process of the persistent luminescence of the affixing material.

Because lighting device incorporates the affixing layer with the photo active or photochromic material, the lighting device is going to provide light after the LEEs are off. If the lighting device is using A/C voltage to drive the LEE's, during the off cycle of the AC, the LED can be off but because the material surrounding the LEE has the material that is excited by the LEE and produces a persistent luminescence, there is no need to use additionally electronic circuitry which are conventionally used specifically to avoid the flicker in a flicker-avoiding lighting device.

Consequently, the lighting device can be used with AC power to avoid flickering, without using the special flicker-avoiding circuitry.

Thus, according to an embodiment, in the first mode, while using AC voltage to drive the light-emitting elements, during the off-cycle of the AC, the light-emitting elements are off and the affixing layer surrounding the light-emitting elements produces the persistent luminescence for at least an entire duration of the off-cycle of the AC, to avoid flickering during the off-cycle.

Second Embodiment

Figure 4:
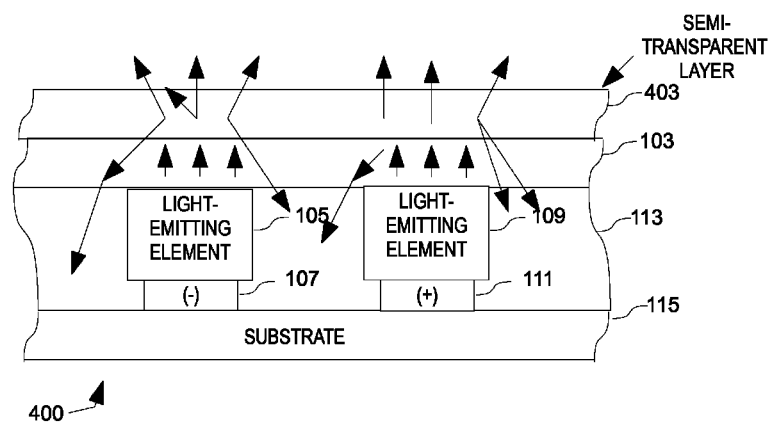
FIG. 4 is a cross-sectional view of a lighting device according to a second embodiment with a semi-transparent layer.

Referring now to FIG. 4, a cross-sectional view of a lighting device according to a second embodiment with a semi-transparent layer will be discussed and described. In review, a lighting device 400 can include a conductive layer 103, light emitting elements 105, 109, electrical connections 107, 111, an affixing layer 113, and a substrate 115. In this lighting device, there is also provided an additional transparent or semitransparent layer 403 on top of the conductive layer 103 (referring to the "top" direction of the LEE 105, 109 being the portion from which light is emitted), which sandwiches the transparent conductive layer 103. The additional semi-transparent layer that bounces additional light back from the LEE 105, 109 into the affixing layer 113. Thus, the semi-transparent layer 403 can provide additional excitation of the doped affixing layer 113. Furthermore, the semi-transparent layer 403 can be non-conductive.

The light emitted from the LEEs 105, 109 excites the doped affixing layer 113 as described above. In addition, the use of the additional semi-transparent layer 403 allows the further excitation of the doped affixing material 133, especially in parts of the doped affixing material which are further away from the LEE 105, 109, in addition to the parts of the doped affixing layer 113 which are directly adjacent to the LEE, 105, 109 or which are on top of a flip chip (not illustrated in FIG. 4). Because the light from the LEE 105, 109 can bounce back to the affixing layer 113 due to use of the additional semi-transparent layer 403, they are bounced to the other parts of the doped affixing layer 113, the light consequently excites the other molecules which are further away from the LEE 105, 109. Ordinarily, as in this illustration, the LEEs 105, 109 are disposed to face up; however, if the additional semi-transparent layer 403 is used on top of the structure of the third embodiment of FIG. 5, the light bounces around in more of the affixing layer 113. So, the affixing material 113 gets light not only from the LEEs 105, 109 but also from the bounce back from the additional semi-transparent layer 403, which will allow additional excitation of the photo active or photochromic material.

In FIG. 4, the additional layer 403 is transparent or semi-transparent material, to allow some of the light to be emitted from the LEE 105, 109, but for example may convert the light from the LEE to a different color, for example blue or white light. If the additional layer 403 is a reflective material, light will bounce back into the affixing layer 113.

This variation works for both the flip and non-flip chip embodiments. In the flip chip embodiment, the bottom substrate, on which the LED sits on may be transparent, so light comes out from the bottom of the lighting device (around the bottom of the LED) which has bounced back from the top substrate. If the substrate on which the LEDs sits is transparent or not transparent, light bounces (or does not bounce). At least one substrate can be transparent. It is not necessary to have two substrates in the case that the flip chip structure is used.

Although this embodiment is illustrated in connection with the non-flip chip variation, such as the first embodiment discussed above, this embodiment can be used for a flip chip variation, such as discussed in the third embodiment in connection with FIG. 5 for example. In the flip chip variation, the bottom substrate, which the LED is sitting on and which is opposite to the "top" of the LED, may be transparent, so light may be emitted from the bottom of the lighting device (around the bottom of the LED) which has bounced back from the top substrate. If the substrate on which the LEDs sits is transparent or non-transparent, light bounces or does not bounce, respectively. At least one substrate can be transparent.

It is not necessary to have two substrates in the situation that the flip chip structure is used.

The variation of the second embodiment of FIG. 4 provides the semi-transparent layer 403 for additional excitation of the doped affixing layer 113.

Thus, in still another embodiment, the lighting device further includes a semi-transparent layer sandwiching the transparent conductive layer, the semi-transparent layer bounces at least some of the light from the light-emitting layer back into the affixing layer to further excite the affixing layer to produce additional persistent luminescence.

Third Embodiment

Figure 5:
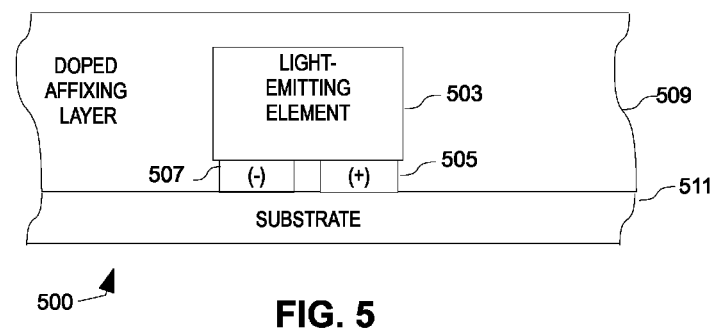
FIG. 5 is a cross-sectional view of a lighting device according to a third embodiment.

Referring now to FIG. 5, a cross-sectional view of a lighting device according to a third embodiment will be discussed and described. In FIG. 5, there is illustrated a lighting device 500 that can include light emitting elements 503, positive and negative electrodes 505, 507, an affixing layer 509, and a substrate 511.

The LEE 503 is representative of one or more LEEs. In the third embodiment, illustrated in FIG. 5, sometimes referred to herein as a "flip chip", the transparent or semi-transparent conductive layer of the first embodiment can be omitted because the electrical circuit is closed by the gap between the two electrodes 505, 507 that are on the same side of the LEE 503; it is not necessary to make the connection on top of the LEE. This is one of the primary differences between the first and third embodiments. Another primary difference is that the doped affixing layer of the lighting device 500 of FIG. 5 forms a protective surrounding layer that fixes the light-emitting elements 503 in place.

The affixing layer 509 can be doped as further discussed in this document into a photo active or photochromic material which is a material that provides a luminescent emission after excitation.

In the flip chip there are electrodes 507, 509 on same side of the light emitting element 503. The electrodes 507, 509 are electrically connected between the substrate 511 and the light emitting element 503. There is the affixing layer 509, which can be for example the hot melt, next to the LEE 503. That hot melt will have the photo active or photochromic material doped therein. The affixing layer 509 is a material which is electrically insulating. The affixing layer 509 physically affixes the LEE 503 to the substrate 511, and affixes plural LEEs 503 to each other.

Thus, according to an embodiment, there is provided a lighting device, which includes a substrate; two or more light-emitting elements formed over the substrate; a protective surrounding layer fixing the two or more light-emitting elements in place. The protective surrounding layer is doped with a photo active or photochromic material. In a first mode when the light-emitting elements are energized, the photo active or photochromic material of the affixing layer is excited by the light-emitting elements. In a second mode when the light-emitting elements are de-energized, the affixing layer produces a persistent luminescence. Further, in an embodiment, in the first mode, while using AC voltage to drive the light-emitting elements, during the off-cycle of the AC, the light-emitting elements are off and the protective surrounding layer surrounding the light-emitting elements produces the persistent luminescence for at least an entire duration of the off-cycle of the AC, to avoid flickering during the off-cycle.

It should be noted that the third embodiment of FIG. 5 can be combined with the additional semi-transparent layer illustrated in FIG. 4. Consequently, a variation of the embodiment of FIG. 5 further includes a semi-transparent layer sandwiching the protective surrounding layer, the semi-transparent layer bounces at least some of the light from the light-emitting layer back into the protective surrounding layer to further excite the protective surrounding layer to produce additional persistent luminescence.

Fourth Embodiment

Figure 6A:
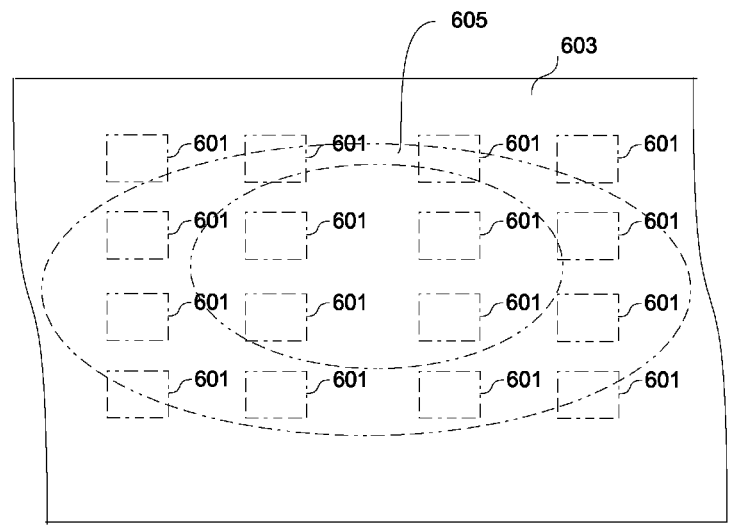
FIG. 6A and FIG. 6B (collectively, FIG. 6) are a plan view of a lighting device in a powered on mode and a powered off mode, with a pattern of non-persistent luminescent areas, according to a fourth embodiment.
Figure 6B:
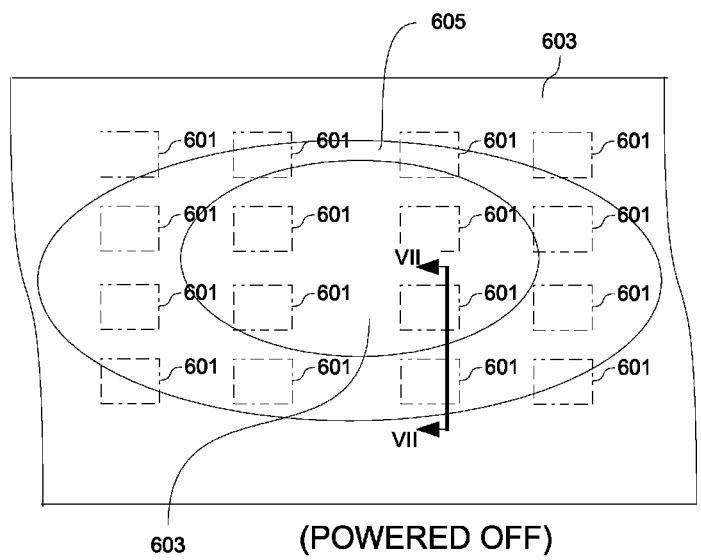
Figure 7:
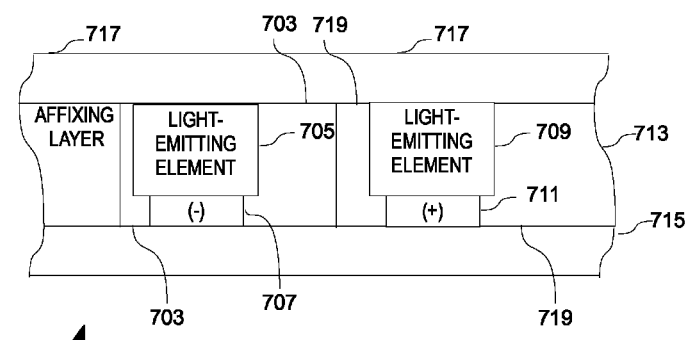
FIG. 7 is a cross section along line VII of the lighting device of FIG. 6B.

FIG. 6A, FIG. 6B, and FIG. 7 illustrate an embodiment in which there is provided a lighting device with a pattern of persistent and non-persistent luminescent areas. FIG. 6A and FIG. 6B are plan views which illustrate an effect of the lighting device in powered on mode and powered off mode, respectively, and FIG. 7 is a cross section of FIG. 6B. As can be seen, the pattern of the persistent luminescent areas, which are excited in a power-on mode, continues to provide light in a power-off mode and accordingly can act as a marker. Uses might include, for example, an exit or emergency marker, sometimes collectively referred to as an "egress" marker or light, in which the luminescence persists after the current flow is cut to the lighting device. This can avoid use of luminescent or reflective layers which might undesirably affect an appearance of a lighting device.

Referring now to FIG. 6A and FIG. 6B (collectively, FIG. 6), a plan view of a lighting device in a powered on mode and a powered off mode, with a pattern of non-persistent luminescent areas, according to a fourth embodiment will be discussed and described. There are illustrated a light emitting elements 601, a persistent luminescent area 605, and non-persistent luminescent areas 603. The persistent luminescent area 605 can represent a plurality of such areas, which can be in any desired shape, such as lettering illustrated here. The persistent luminescent area 605 can be structured as discussed above in detail. The non-persistent luminescent area 603 can be structure similarly to discussed above, however, without using an affixing layer which is doped with a photo active or photochromic material. The light emitting elements 601 can be provided in any desired pattern, provided that they excite the doped affixing layer of the persistent luminescent area 605. The light emitting elements 601 can also be provided outside the doped affixing layer if desired. Thus, when the lighting device is powered on as illustrated in FIG. 6A, it produces a typical luminescence, and the persistent luminescent area 605 can be indistinguishable in amount of luminescent in comparison to the non-persistent luminescent area 603. Thus, the pattern provided by the luminescent area 605 is not noticeable to a viewer in a powered up mode (sometimes referred to as a powered-up mode).

Reference is now made to FIG. 6B. Recall that the non-persistent luminescent areas 603 are not doped with photo active or photochromic material, or have a quick-decay luminescent material, in comparison to the persistent luminescent area 605 which has a relatively long decay luminescent material. Now, as illustrated in FIG. 6B, when the lighting device is powered off (sometimes referred to as a powered-down mode), the non-persistent luminescent areas 603 are dark in comparison to the persistent luminescent area 605 produce a persistent luminescence. Consequently, the pattern of the persistent luminescent area 605 becomes visible to the human eye and noticeable to a viewer in the powered off mode.

The persistent luminescent areas 605 can be conveniently provided in a pattern of letters or symbols which are not visible when the lighting device is powered on, but are visible for a fairly long time (for example, several minutes to hours) without using any power when the lighting device is powered off, such as in a power failure or similar situation. Thus, an embodiment provides an emergency light. The emergency light includes one or more combinations of embodiments of the lighting device discussed herein, driven by DC voltage. In a power-on mode the DC voltage drives the light emitting elements. In a power-off mode, the DC voltage does not drive the light emitting elements, and the affixing layer acts as a persistent luminescent marker. Another embodiment is a variation of the flip chip embodiment, which provides an emergency light as above, in which the protective surrounding layer of the flip chip acts as the persistent luminescent marker.

Referring now to FIG. 7, a cross section along line VII of the lighting device of FIG. 6B will be discussed and described. This cross section of the lighting device 700 illustrates the non-persistent luminescent areas 719 which are not doped with photo active or photochromic material, the persistent luminescent area(s) 703, the light-emitting elements 705, 709, the substrate 715, the positive and negative electrodes 707, 711, and the transparent conductive layer 717. Thus, in an embodiment, the affixing layer includes non-doped areas to comprise a pattern of a pre-determined non-persistent-luminescent area.

The pattern of persistent and non-persistent areas can be formed by being separately patterned when the lighting device 700 is formed, as discussed below in connection with FIG. 9A to FIG. 9F.

In a variation, the LEE can face downwards (away from the top) to the non-transparent substrate, especially where the important feature is simply the persistent luminescence, for example, in an EXIT feature, or when the battery or power is no longer provided. (To avoid flicker, the LEDs can be facing upward.)

In this document, the designation "powered down" is used to specifically indicate that the entire lighting element is powered down (no more energy), as distinguished from the negative part of the wave of the AC cycle.

Additional Variations

Additional variations are discussed herein to provide an appreciation for the scope hereof.

In a further embodiment, the light-emitting elements can be oriented any direction in the affixing layer, to emit the persistent luminescence when the lighting device is powered down. For example, the light emitting elements of FIG. 6A and FIG. 6B, which might be oriented to emit light toward a top, can in fact be oriented to face a bottom, or can be oriented sideways. In the situation of FIG. 6A and FIG. 6B, it may be considered that the persistent luminescence is the most important feature of the lighting device provided, for example, when electricity fails, and that lighting provided by the lighting device when power is on is not important; consequently the orientation of the light emitting elements may be unimportant.

Processes for Forming the Lighting Device

Referring now to FIG. 8A to FIG. 8D, cross sections of a lighting device illustrating a method of forming the lighting device will be discussed and described.

Figure 8A:
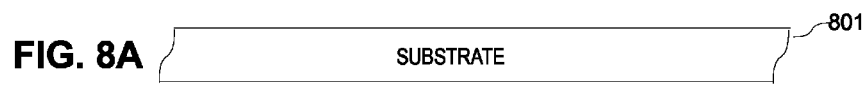
FIG. 8A to FIG. 8D are cross sections of a lighting device illustrating a method of forming the lighting device.
Figure 8B:
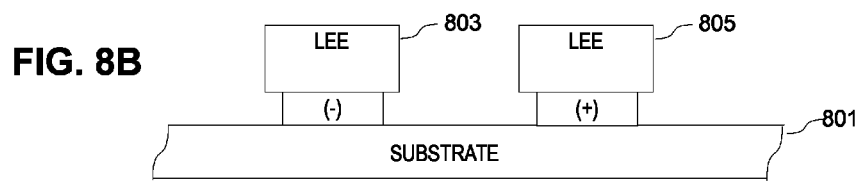
Figure 8C:
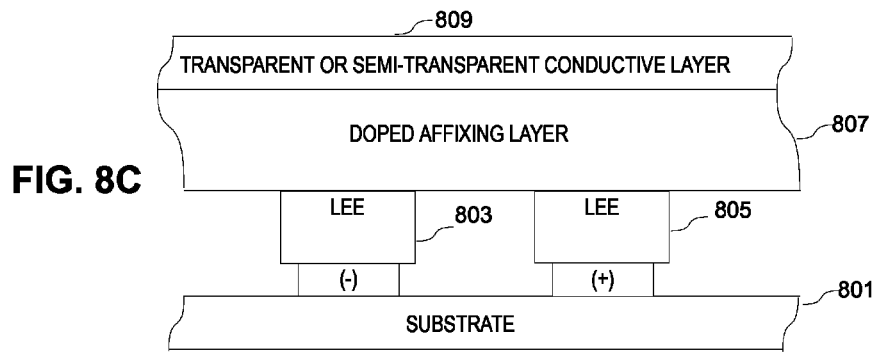
Figure 8D:
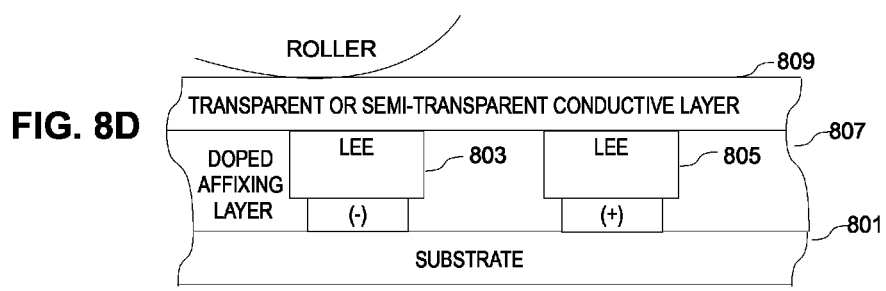

Generally, processing for laying down the substrate 801 as in FIG. 8A, patterning the light emitting elements 803, 805 on the substrate 801 as in FIG. 8B, laying down an affixing layer and a transparent or semi-transparent conductive layer 809, and rolling the layers is known.

However, in comparison to the known processing, the affixing layer 807 is doped with a photo active or photochromic material. The affixing layer 807 can be doped before it is laid down and used in the process. The lighting device formed by this method thus includes the doped affixing layer as an integral part of the structural connection between the substrates, and between the light emitting elements.

The affixing layer is configured to fix the light-emitting element in place. Because light from the light-emitting element may need to pass through the affixing layer, it is generally desirable that the material that is doped with the photo active or photochromic material be substantially transparent to the wavelength of light that are emitted from the light-emitting element.

Thus, there can be a method of forming a lighting device. The method includes providing a substrate; forming two or more light-emitting elements over the substrate; forming an affixing layer on the substrate fixing the two or more light-emitting elements in place; and forming a transparent conductive layer over the affixing layer. The substrate and the transparent conductive layer sandwich the affixing layer with the light-emitting elements in place. The affixing layer is an electrically insulating material. The affixing layer is doped with a photo active or photochromic material. In a first mode when the light-emitting elements are energized, the photo active or photochromic material of the affixing layer is excited by the light-emitting elements. In a second mode when the light-emitting elements are de-energized, the affixing layer produces a persistent luminescence when energized.

In a variation of the method, the transparent conductive layer is semi-transparent and bounces at least some of the light from the light-emitting elements back into the affixing layer to further excite the affixing layer to produce additional persistent luminescence.

Another variation of the method can further include forming an additional semi-transparent layer on the transparent conductive layer, so that the additional semi-transparent layer bounces at least some of the light from the light-emitting layer back into the affixing layer to further excite the affixing layer to produce additional persistent luminescence.

In another variation of the method, the wave length of the light-emitting elements is UV or blue.

It is possible to create patterns of glowing and non-glowing areas of the affixing material: the affixing layer without doping is laid down, and then the affixing layer with doping is laid down. Alternatively, the affixing layer with the doping can be laid down before laying down the affixing layer without doping. This can create the lighting device that has a pattern of non-persistent luminescent areas and persistent luminescent areas.

Referring now to FIG. 9A to FIG. 9F, cross sections of a lighting device with a pattern of persistent and non-persistent luminescent areas, illustrating a method of forming the lighting device will be discussed and described. The process of FIG. 9A to FIG. 9F is a variation of the process of FIG. 8A to FIG. 8D; consequently, some details discussed above are omitted in the following discussion.

Figure 9A:
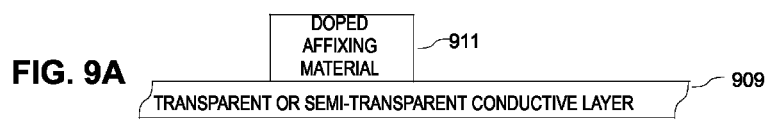
FIG. 9A to FIG. 9F are cross sections of a lighting device with a pattern of persistent and non-persistent luminescent areas, illustrating a method of forming the lighting device.
Figure 9B:
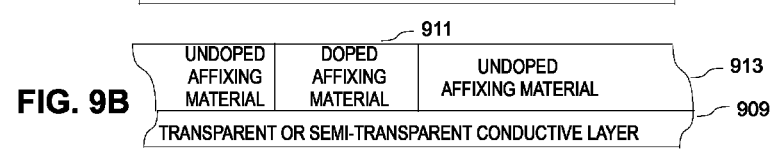
Figure 9C:
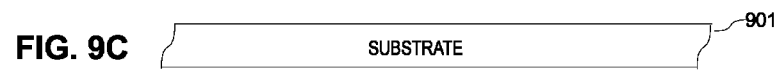
Figure 9D:
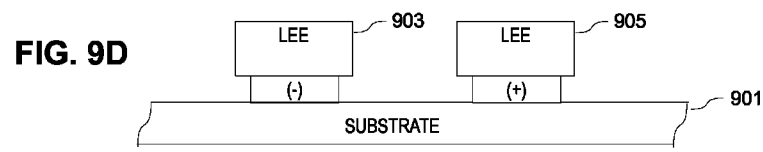
Figure 9E:
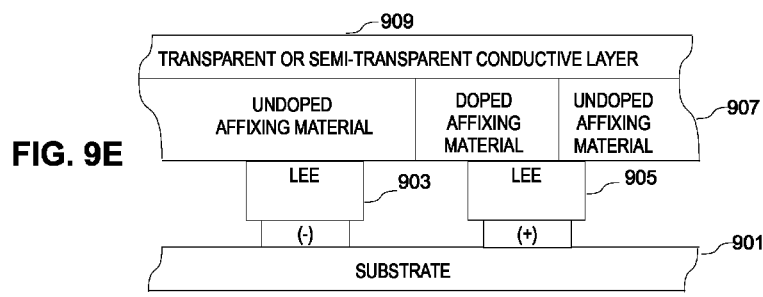
Figure 9F:
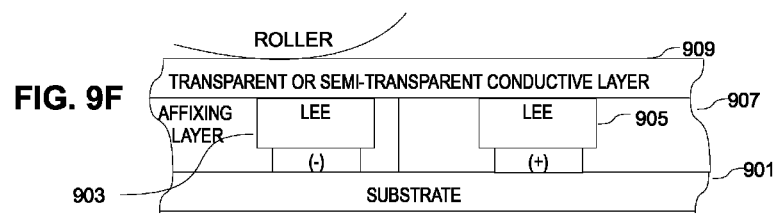

The process can include laying down the transparent or semi-transparent conductive layer 909 as in FIG. 9A and patterning a doped affixing material 911 onto the transparent or semi-transparent conductive layer 909. Then, an undoped affixing material 913 is placed onto the transparent or semi-transparent conductive layer 909 between the patterned areas of the doped affixing material 911, as shown in FIG. 9B. It is possible to pattern the undoped affixing material before applying the doped affixing material. Thus, the pattern of doped and undoped affixing material 911, 913 is prepared on the transparent or semi-transparent conductive layer 909. The process can include laying down the substrate 901 as illustrated in FIG. 9C; and patterning the light emitting elements 903, 905 on the substrate 901 as in FIG. 9D according to known techniques. Then, the transparent or semi-transparent conductive layer 909 with the pattern of doped and undoped affixing material 907 is laid down (using known techniques for placement) on top of the LEEs as illustrated in FIG. 9E. Subsequent to stacking the layers, the layers which are now stacked are pressed together, for example using a roller and known techniques, as shown in FIG. 9F.

Thus, an embodiment can include pre-forming the affixing layer to include non-doped areas to comprise a pattern of a pre-determined non-persistent-luminescent area.

Accordingly, there may be provided a method of forming a lighting device. The method can included providing a substrate; forming two or more light-emitting elements over the substrate; and forming a protective surrounding layer on the substrate with the two or more light-emitting elements, the protective surrounding layer fixes the two or more light-emitting elements in place. The protective surrounding layer is doped with a photo active or photochromic material. In a first mode when the light-emitting elements are energized, the photo active or photochromic material of the protective surrounding layer is excited by the light-emitting elements. In a second mode when the light-emitting elements are de-energized, the protective surrounding layer produces a persistent luminescence.

Similar techniques can be used to prepare the lighting devices of the first, second, third and/or fourth embodiments, and variations discussed herein.

CONCLUSION

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled. The various circuits described above can be implemented in discrete circuits or integrated circuits, as desired by implementation.

What is claimed is:

1. A lighting device, comprising:
   a substrate;
   two or more light-emitting elements formed over the substrate;
   an affixing layer fixing the two or more light-emitting elements in place;
   a transparent conductive layer in electrical contact with the light-emitting elements;
   the substrate and the transparent conductive layer sandwich the affixing layer with the light-emitting elements in place;
   the affixing layer is an electrically insulating material;
   the affixing layer is doped with a photo active or photochromic material,
      in a first mode when the light-emitting elements are energized, the photo active or photochromic material of the affixing layer is excited by the light-emitting elements, and
      in a second mode when the light-emitting elements are de-energized, the affixing layer produces a persistent luminescence.

2. The lighting device of claim 1, further comprising, in the first mode, while using AC voltage to drive the light-emitting elements, during any one off-cycle of the AC, the light-emitting elements are off and the affixing layer surrounding the light-emitting elements produces the persistent luminescence for at least a duration of the one off-cycle of the AC, to avoid flickering during the one off-cycle.

3. The lighting device of claim 1, wherein the transparent conductive layer is semi-transparent and bounces at least some of the light from the light-emitting elements back into the affixing layer to further excite the affixing layer to produce additional persistent luminescence.

4. The lighting device of claim 1, further comprising a semi-transparent layer sandwiching the transparent conductive layer, the semi-transparent layer bounces at least some of the light from the light-emitting layer back into the affixing layer to further excite the affixing layer to produce additional persistent luminescence.

5. The lighting device of claim 1, wherein the light-emitting elements can be oriented any direction in the affixing layer, to emit the persistent luminescence when the lighting device is powered down.

6. The lighting device of claim 1, wherein the wave length of the light-emitting elements is UV or blue.

7. The lighting device of claim 1, the affixing layer includes non-doped areas to comprise a pattern of a pre-determined non-persistent-luminescent area.

8. An emergency light comprising:
   the lighting device of claim 1, driven by DC voltage,
   in a power-on mode the DC voltage drives the light emitting elements,
   in a power-off mode, the DC voltage does not drive the light emitting elements, and the affixing layer acts as a persistent luminescent marker.

9. A lighting device, comprising:
   a substrate;
   two or more light-emitting elements formed over the substrate;
   a protective surrounding layer fixing the two or more light-emitting elements in place;
   the protective surrounding layer is doped with a photo active or photochromic material,
      in a first mode when the light-emitting elements are energized, the photo active or photochromic material of the affixing layer is excited by the light-emitting elements, and
      in a second mode when the light-emitting elements are de-energized, the affixing layer produces a persistent luminescence.

10. The lighting device of claim 9, further comprising, in the first mode, while using AC voltage to drive the light-emitting elements, during any one off-cycle of the AC, the light-emitting elements are off and the affixing layer surrounding the light-emitting elements produces the persistent luminescence for at least a duration of the one off-cycle of the AC, to avoid flickering during the one off-cycle.

11. The lighting device of claim 9, further comprising a semi-transparent layer sandwiching the protective surrounding layer, the semi-transparent layer bounces at least some of the light from the light-emitting layer back into the protective surrounding layer to further excite the protective surrounding layer to produce additional persistent luminescence.

12. The lighting device of claim 9, wherein the light-emitting elements can be oriented any direction in the protective surrounding layer, to emit the persistent luminescence when the lighting device is powered down.

13. The lighting device of claim 9, wherein the wave length of the light-emitting elements is UV and/or blue.

14. An emergency light comprising:
the lighting device of claim 9, driven by DC voltage,
in a power-on mode the DC voltage drives the light emitting elements,
in a power-off mode, the DC voltage does not drive the light emitting elements, and the protective surrounding layer acts as a persistent luminescent marker.

15. A method of forming a lighting device, comprising:
providing a substrate;
forming two or more light-emitting elements over the substrate;
forming an affixing layer on the substrate fixing the two or more light-emitting elements in place; and
forming a transparent conductive layer over the affixing layer;
wherein the substrate and the transparent conductive layer sandwich the affixing layer with the light-emitting elements in place;
wherein the affixing layer is an electrically insulating material;
wherein the affixing layer is doped with a photo active or photochromic material,
in a first mode when the light-emitting elements are energized, the photo active or photochromic material of the affixing layer is excited by the light-emitting elements,
in a second mode when the light-emitting elements are de-energized, the affixing layer produces a persistent luminescence when energized.

16. The method of claim 15, wherein the transparent conductive layer is semi-transparent and bounces at least some of the light from the light-emitting elements back into the affixing layer to further excite the affixing layer to produce additional persistent luminescence.

17. The method of claim 15, further comprising
forming a semi-transparent layer on the transparent conductive layer, the semi-transparent layer bounces at least some of the light from the light-emitting layer back into the affixing layer to further excite the affixing layer to produce additional persistent luminescence.

18. The method of claim 15, wherein the wave length of the light-emitting elements is UV or blue.

19. The method of claim 15, further comprising
pre-forming the affixing layer to include non-doped areas to comprise a pattern of a pre-determined non-persistent-luminescent area.

20. A method of forming a lighting device, comprising:
providing a substrate;
forming two or more light-emitting elements over the substrate; and
forming a protective surrounding layer on the substrate with the two or more light-emitting elements, the protective surrounding layer fixes the two or more light-emitting elements in place;
wherein the protective surrounding layer is doped with a photo active or photochromic material,
in a first mode when the light-emitting elements are energized, the photo active or photochromic material of the protective surrounding layer is excited by the light-emitting elements, and
in a second mode when the light-emitting elements are de-energized, the protective surrounding layer produces a persistent luminescence.

21. The method of claim 20, further comprising
forming a semi-transparent layer on the protective surrounding layer, the semi-transparent layer bounces at least some of the light from the light-emitting layer back into the protective surrounding layer to further excite the protective surrounding layer to produce additional persistent luminescence.

22. The method of claim 20, wherein the wave length of the light-emitting elements is UV and/or blue.

\* \* \* \* \*